United States Patent [19]

Lyons

[11] Patent Number: 6,006,232

[45] Date of Patent: Dec. 21, 1999

[54] SYSTEM AND METHOD FOR MULTIRECORD COMPRESSION IN A RELATIONAL DATABASE

[75] Inventor: Kenneth Brent Lyons, Lebanon, N.J.

[73] Assignee: AT&T Corp., New York, N.Y.

[21] Appl. No.: 08/954,965

[22] Filed: Oct. 21, 1997

[51] Int. Cl.[6] .................................................. G06F 17/30
[52] U.S. Cl. ............................ 707/101; 707/1; 707/100
[58] Field of Search ............................. 707/103, 1, 100, 707/2, 101; 711/112; 341/106, 87

[56] References Cited

U.S. PATENT DOCUMENTS

| | | | |
|---|---|---|---|
| 3,656,178 | 4/1972 | De Maine et al. ........................ | 341/87 |
| 4,827,411 | 5/1989 | Arrowood et al. ...................... | 707/206 |
| 4,868,570 | 9/1989 | Davis ....................................... | 707/101 |
| 4,965,772 | 10/1990 | Daniel et al. ........................ | 395/200.54 |
| 5,121,494 | 6/1992 | Dias et al. ................................. | 707/2 |
| 5,281,967 | 1/1994 | Jung ......................................... | 341/55 |
| 5,369,761 | 11/1994 | Conley et al. ............................ | 707/2 |
| 5,481,701 | 1/1996 | Chambers, IV ........................ | 707/101 |
| 5,555,244 | 9/1996 | Gupta et al. ............................ | 370/397 |
| 5,584,026 | 12/1996 | Knudsen et al. ............................ | 707/1 |
| 5,594,899 | 1/1997 | Knudsen et al. ............................ | 707/2 |
| 5,596,746 | 1/1997 | Shen et al. ............................... | 707/101 |
| 5,603,022 | 2/1997 | Ng et al. ................................. | 707/101 |
| 5,603,025 | 2/1997 | Tabb et al. ................................. | 707/2 |
| 5,615,367 | 3/1997 | Bennett et al. ........................ | 707/102 |
| 5,673,265 | 9/1997 | Gupta et al. ............................ | 370/432 |
| 5,694,598 | 12/1997 | Durand et al. .......................... | 707/103 |
| 5,787,440 | 7/1998 | Bakke et al. ............................. | 707/103 |
| 5,809,505 | 9/1998 | Lo et al. .................................. | 707/102 |
| 5,893,108 | 4/1999 | Srinivansan et al. ................... | 707/103 |

OTHER PUBLICATIONS

James J. Hunt et al., "An Empirical Study of Delta Algorithms", IEEE Software Configuration and Maintenance Workshop, 1996.

*Primary Examiner*—Paul R. Lintz
*Assistant Examiner*—Ella Colbert
*Attorney, Agent, or Firm*—Oliff & Berridge, PLC

[57] ABSTRACT

The invention is a system and method for database compression which creates partial indexing into compressed sub table blocks of databases. Table rows with the same or related indexing parameters are grouped as "sub-table blocks" and are stored as compressed binary objects, with the indexing fields stored in the same row, external to the binary block. The binary object expands to multiple database rows when accessed via the sub table block interface, thus forming a hierarchical, pre-joined database organization. Mechanisms are provided for creating, accessing, and manipulating the data blocks, and a date-based versioning mechanism. The compression employed is the known Vdelta package, which operates at a byte level to provide a useful compromise between speed and compression efficiency, even for relative short compression blocks. In realistic tests, the I/O time gained through compression results in a time saving which exceeds the processing penalty. The overall compression ratio is data dependent, but in a realistic test it averages about 4.

24 Claims, 4 Drawing Sheets

FIG. 5

| TEST | TIME |
|---|---|
| DECREMENT/INCREMENT, NONVERSIONED TABLE OPEN (200 ROWS, COMPRESSED) ROW ACCESS (AVG OVER 200 ROW TABLE) TABLE CONSTRUCT AND REPLACE TABLE EDIT AND VERSIONING DECREMENT/INCREMENT, W/VERSIONING | 2.3 ms 0.54 ms 15 $\mu$s 10 ms 15 ms 2.8 ms |

FIG. 6

| TABLE TYPE | LOAD TIME ($\mu$S/ROW) | RETRIEVAL COUNT ONLY | ($\mu$S/ROW) ACTUAL READ | STORAGE (MB) |
|---|---|---|---|---|
| NORMAL, UNCLUSTERED INDEX | 1405 | 427 | 2156 | 300 |
| NORMAL, CLUSTERED INDEX | 1074 | 456 | 456 | 198 |
| WITH STB COLUMN | 113 | 4 | 101 | 68 |

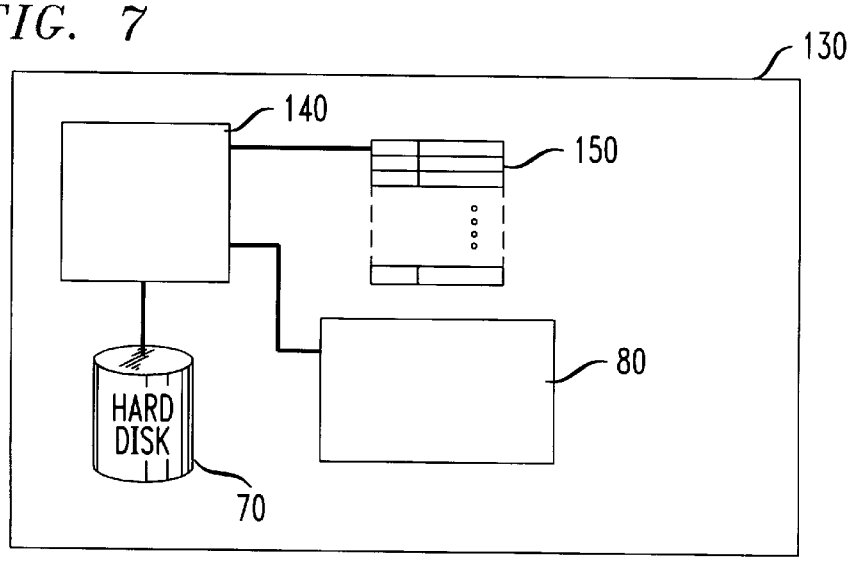

FIG. 7

SYSTEM AND METHOD FOR MULTIRECORD COMPRESSION IN A RELATIONAL DATABASE

BACKGROUND OF THE INVENTION

1. Field of Invention

The invention relates to information technology, and more particularly to techniques for compressing databases containing large amounts of information.

2. Description of Related Art

In relational database technology, one of the most important questions affecting storage requirements is the level of indexing, or pointers into related data fields, required. Indexing can be expensive in terms of storage in database tables with many lines per index entry. Unless index information is implicit in the physical position of the data, as in some implementations of clustered indexes or hash indexes, the creation of an index can greatly expand the total storage requirements. The implementation used in such commercially available systems as SQLServer, Informix, and Sybase in fact causes the index information to be repeated for every row of information. With long index fields, this becomes costly.

Since repeated byte strings are easily represented in a compressed format, such situations, especially where very large databases (VLDBs, typically terabyte) are concerned, are prime candidates for the use of compression technology. It is desirable, though, to find some intermediate ground between known large-block, high compression algorithms which degrade access time for small data segments and impede indexing capability, and the usual VLDB situation in which no compression is employed.

SUMMARY OF THE INVENTION

The invention overcoming these and other problems in the art relates to a system and method for multirecord compression which effects partial multirecord compression while maintaining indexability and satisfactory access times. The fundamental object used in the invention is a Sub Table Block (STB), which is a compressed block of table lines, intended to be stored as a binary object within a database, and to be viewed as a block of lines with common or related index fields (as shown in FIG. 3). The structure of the uncompressed block is defined by a Sub Table Block Structure (STBSTRUC), and individual rows are referenced using Sub Table Block Rows (STBROWs). In carrying out the invention, the inventor has employed a known fast compression package Vdelta, described in James J. Hunt, Kiem-Phong Vo, and Walter F. Tichy, "An Empirical Study of Delta Algorithms", IEEE Software Configuration and Maintenance Workshop, 1996, incorporated by reference, to implement a class library which defines these and other related types of objects. These structures may for instance be implemented in the commercially available Visual C++ programming language, as the inventor has done on a Pentium PC-based system running SQLServer6.0 under Windows NT.

In the illustrative embodiment, rows of the database are entirely fixed-length, under the assumption that the compression inherent in the invention obviates much of the need for variable length capability. However, use of a variable length approach is also possible. The ability of the Vdelta technique to provide a compact form for related binary objects is also used to implement an incremental versioning scheme.

The invention is illustratively applicable to a database of network call detail records, organized by a cluster index on the basis of originating phone number and bill period, illustrated generally in FIG. 4. The index information need appear only once in each row, and then an STB can be employed to represent the detail information on all related calls sharing that index for a single bill. Additional index fields can be included in the row as appropriate. The size of the typical bill is such that a few kilobytes (kB) is sufficient to store the compressed version, thus yielding highly efficient I/O access to the data when it is needed. This is especially true for telephony applications such as customer care or billing, where it is usually necessary to access all the rows in a bill at the same time.

The invention also provides a natural mechanism for versioning of the data, since the Vdelta algorithm inherently includes such a capability. By use of time stamps and storage of compressed deltas, several versions of an STB can be stored in a single binary object with high efficiency, and it becomes a straightforward matter to retrieve the data as of a specified date. For example, a bill image could be finalized as of the billing date, and subsequent changes would then be implemented as a delta, so that the bill could be retrieved from the database at any time in its original form.

BRIEF DESCRIPTION OF THE DRAWINGS

FIG. 5 illustrates performance data for operation of the invention;

FIG. 6 illustrates additional performance data of the invention; and

FIG. 7 illustrates hardware implementing the system and method of the invention.

DETAILED DESCRIPTION OF PREFERRED EMBODIMENTS

Figure 1:
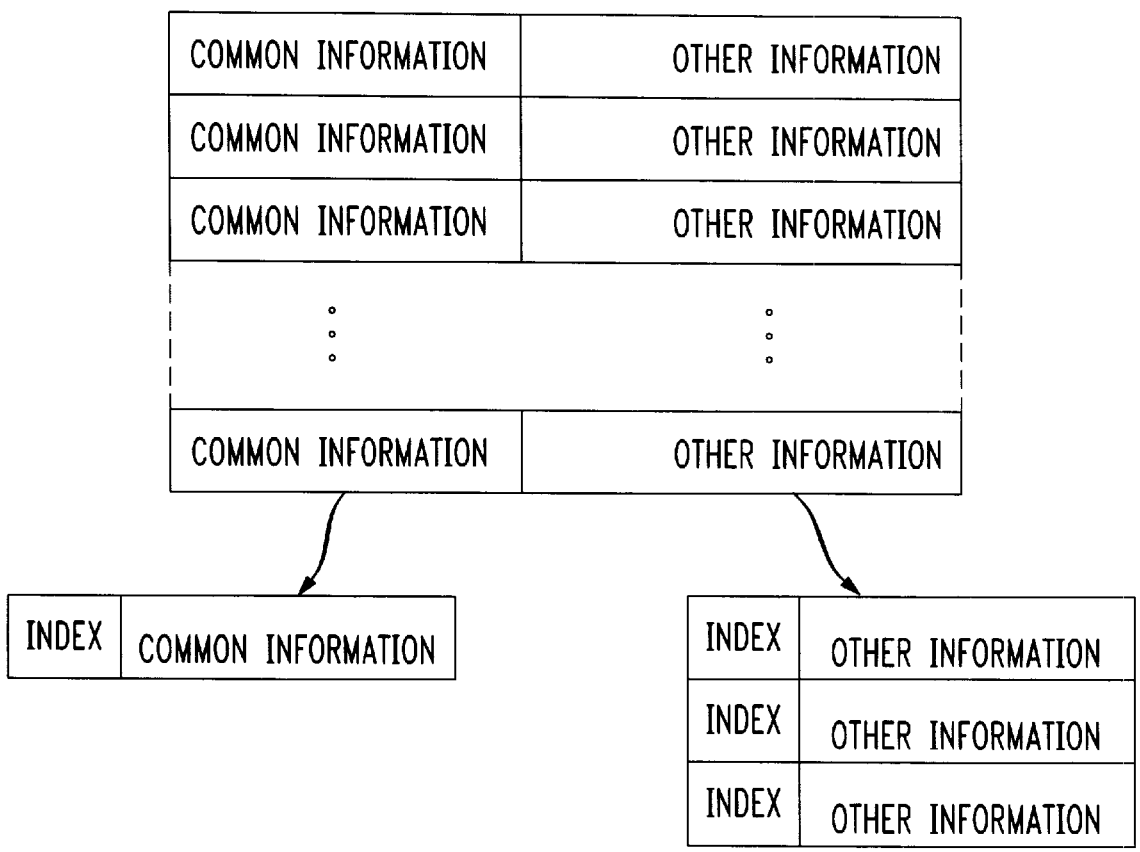
FIG. 1 illustrates known techniques for database storage.

In terms of the philosophy of the system and method of the invention compared to conventional databases, as illustrated in FIG. 1 the traditional means of optimizing storage for a relational database is table normalization, which removes redundant information from rows through indices linking common information to rows having variable related information. Extraction of meaningful data rows then frequently requires join operations in order to reconstruct the desired data from selected rows. With large tables, these joins can be time-consuming operations.

The inventor has realized that the storage cost of leaving the data unnormalized could often be avoided if there were a mechanism for storing partial rows, with repeated fields referred to the previous row. Such a mechanism is not provided in most relational data base systems.

Figure 2:
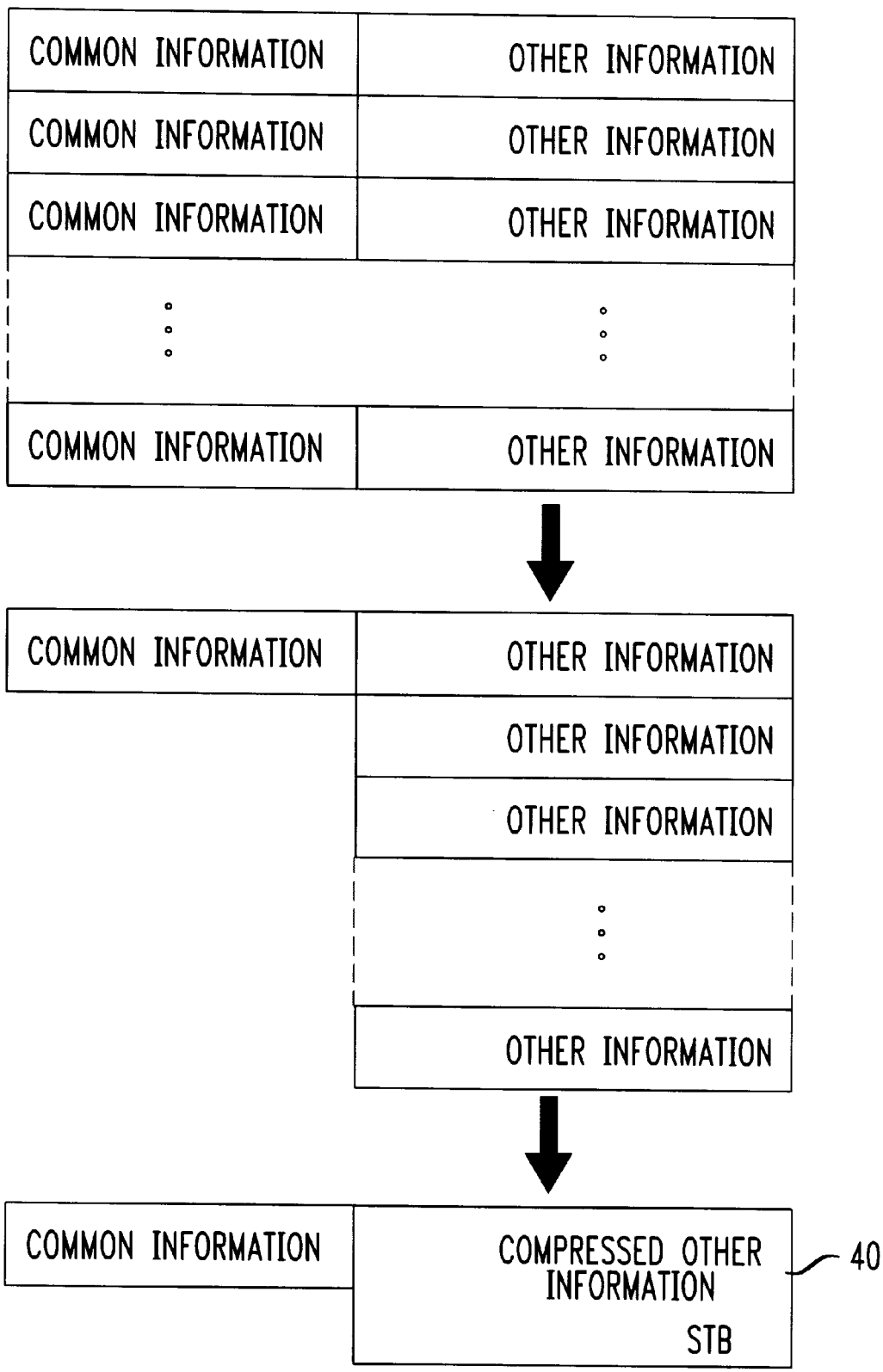
FIG. 2 illustrates a diagram of multirecord compression according to an illustrative embodiment of the invention.
Figures 3, 4:
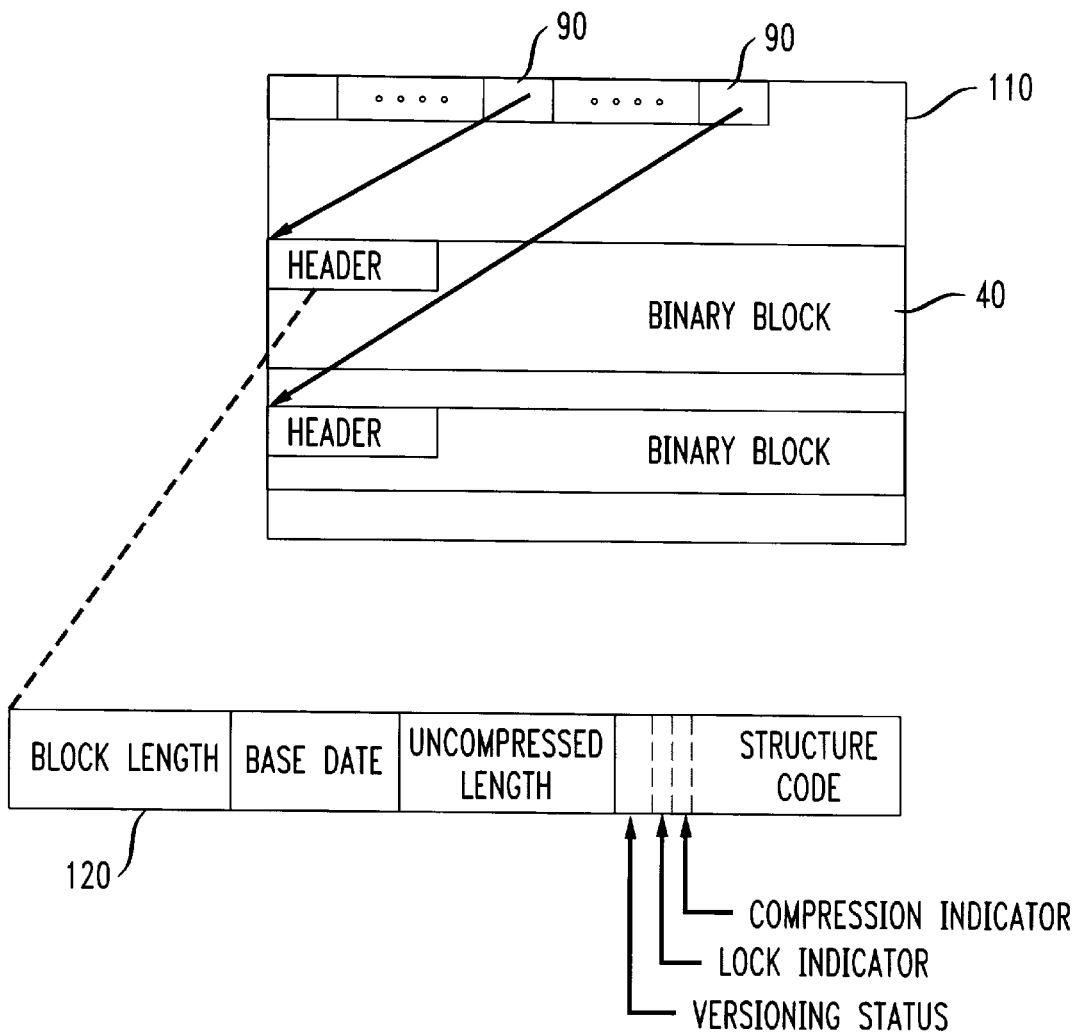
FIG. 3 illustrates a further diagram of data structures according to the invention.
FIG. 4 illustrates a call detail record database.

In the invention, as illustrated generally in FIGS. 2 and 3, a block of such partial rows is viewed as a single object within a single row of the table 110. The repeated fields then appear in the row only once, and during access the partial row object is then expanded in-place to full rows. Again, such multiple-partial-row objects are referred to here as "Sub Table Blocks" (STBs).

The resulting organization of the database table is inherently hierarchical. The detail data contained in the STB is, in a sense, pre-joined with the remainder of the line, with no further indexing required. Such an organization is most useful in a case where there is a sizable (but not huge) number of lines with the same or closely associated indexing parameters, especially if those lines often need to be accessed together. Time gained in reduced I/O is traded against time spent in compression and decompression. The inventor has investigated these performance issues under realistic conditions.

As shown in the illustrative embodiment shown in FIG. 7, the system and method of the invention is implemented on a computer 130 having processor 140, electronic memory 150, hard disk 70 for storage of STB and other information, and other components and interconnections familiar to persons skilled in the art. It will be appreciated that the invention could be implemented in a variety of configurations of hardware, software and combinations thereof.

The Sub Table Blocks 40 (class STB), Sub Table Block Rows 50 (class STBROW), and Sub Table Block Structures 60 (class STBSTRUC) are implemented as public types of programming objects in C++. All three classes are use-counted to aid in garbage collection, and reduce copying operations. The STBs are further organized into pages containing up to 16 data blocks for storage on hard disk 70.

Data is accessed via the API (Application Programming Interface) 80 and is always uncompressed before viewing, and the interface makes its own decision as to when to compress the data. Compression is used only when it will save actual disk space (taking into account the 2 kB page size). Compression or noncompression of the data is transparent to the user of the invention. Data is never compressed when the uncompressed page size is less than a single physical page on hard disk 70. When the uncompressed size of a single data block exceeds a page, it will always be compressed. Data may be compressed earlier if other data blocks in the same STB cause the total size to exceed one page. Individual blocks, as well as the total compressed STB, are limited to 64 kB in size. Given the fact that partial pages result in inefficient use of storage, the preferable size for a complete STB is thus about 8–16 kB. All of the limits indicated above could be relaxed with no change in the fundamental nature of the invention.

An exception to this data structure occurs when a table block is versioned using time/date information. In this case, the data is always stored in compressed form, since the "delta" capability of Vdelta is inherently a compressed format. Versioning mechanisms are known to persons skilled in the art, but are usually very costly in terms of space in database systems.

The organization of the pages and blocks of the resulting information is shown in FIG. 3. A 32-byte header contains pointers 90 to the individual compressed blocks 100 in the page 110. Each block 100 contains its own 8-byte header 120 with information including its status, date, and compressed and uncompressed sizes. (For an uncompressed block, the latter two are equal.) The date header is employed to reduce the storage requirements of dates within the table block 100 to 4 bytes, while preserving usefulness for several centuries.

A schematic diagram of the interior structures of page 110 and block 100 is illustrated in FIG. 3. The minimum page size is 2 kB. The page header 120 consists of 16 2-byte integers which point to block headers within the page 110. Each header 120 for nonversioned data consists of four 2-byte integer fields, specifying (i) the length of the binary block, in bytes, (ii) the 4-bit status field, and a 12-bit structure code, (iii) the uncompressed length of the binary block, and (iv) a base-date for the block.

The set of datatypes supported in the compressed STBs of the illustrative embodiment consists of int, string, dtime, real, and money. These five are mapped in straightforward fashion into most of the commercially standard SQLServer datatypes. There is no support for bit fields or for data of binary type, including text or image blocks or other STB objects. Therefore, in the illustrative embodiment, recursive use of the STB class is not available, although extension to this application is possible.

The structure of the STBs is defined by an accompanying STBSTRUC object, and rows are accessed as STBROW objects. It should be noted that in practice a mechanism is provided to define an STBSTRUC object directly from an empty SQLServer database table, so that a prototype library can be maintained to define the table structures used. The header of each table object contains a structure code which refers to one of these prototype tables.

In terms of access and storage realization, the inventor has carried out an extensive set of tests to characterize the runtime efficiency of the system and method of the invention. These results are summarized in FIGS. 5 and 6. There is no disk I/O time included in the data of FIG. 5, since the data was maintained in electronic memory. The following parameters were used.

i) Decrement/increment test, nonversioned

An STB containing 12 tables was accessed with alternate incrementing and decrementing of the accessed block, causing two different STB blocks to be opened on each cycle. The length of the individual blocks was about 200 rows, and all were compressed, but not versioned.

ii) Table opening test

A single table was alternately opened and deleted. The table contained 200 rows, and was compressed, and resided in the same STB page described above.

iii) Row access

The rows in the table referenced above were accessed individually with getdata( ) calls. The time shown is an average over the entire table.

iv) Table construct and replace

An existing STB was edited by constructing a new table, with modified values, which was then inserted using the replacewith( ) function, to replace the original table data. The original table was compressed, but not versioned.

v) Table edit and versioning

An existing STB was opened and edited in place to modify the data in a randomly selected set of lines. After each editing operation, the table was then set to final status and stored, to create a new version of the data. A total of 15 versions were created in the table, averaging 220 rows long. Approximately half of these were stored using delta versions, while the remainder caused the creation of new base blocks.

vi) Table increment and decrement, versioned

Same as first line, but with versioned data.

The inventor also performed a test of the overall effect that use of the STB structure has on the operation of an SQLServer database. The results, on a per-row basis, shown in FIG. 5, demonstrated significant gains in performance and storage efficiency. This test used a 4-million row table containing data generated by a pseudorandom process, with a record size of 32 bytes. Hence the raw data size was 128 MB. The data was loaded into an initially empty table, and then 1% of the data was retrieved via a SELECT query based on one index field. This sequence was performed for three cases: (i) a normal SQL table, with a non-clustered index;

(ii) a normal SQL table, with a clustered index; and (iii) a SQL table containing STBs as an image column. In this relatively realistic test, the performance gains due to I/O reduction and efficiency of data access far exceeded the penalty imposed by the additional processing required for data structuring, compression and decompression according to the invention.

It should be noted that the tests shown in FIG. 6 were constructed so that the amount of data accessed far exceeded the available disk cache space, adding to realism of performance.

Finally, the inventor has constructed an actual call detail database using the STBs, on multiple nodes of a Windows NT PC cluster. In a full scale test of the invention, 100 GB of raw data (6 days of actual telephone network data) were loaded into an indexed database with a final size of 11 GB, spanning four Pentium PC system nodes. Using this small number of nodes, the loading time for one day of data was about 6–7 hours. This would be greatly reduced on a larger cluster. The typical data access rate in retrieval was using the invention about 10,000 records/second per node. It was found that 6 days of data for one area code (or NPA) could be selected and scanned in times ranging from 20 to 200 seconds, depending on the call activity in the area code chosen.

In the performance data above, little data has been included on overall system level processing performance, since the examination is of the performance of the system and method of the invention itself, independent of disk access issues. One goal of the invention is to maintain table access times (not including I/O) at values substantially less than the average disk access time. That goal has been achieved, since the typical table opening time, even for versioned and rather long table blocks, is on the order of 1 ms in tested implementations, while the typical disk access is on the order of 10–15 ms. In fact, the test data in FIGS. 5 and 6 shows that the gain in I/O time is so significant that the net result can be a large increase in database throughput in global terms. This conclusion is borne out as well by the performance of the call detail database discussed in the preceding paragraph.

The processor and related hardware used in the performance testing was less expensive than that normally associated with high-end database systems, instead being based upon commodity PC systems. Although individual PC nodes are not sufficiently reliable to run business-critical processes, their low cost makes it feasible to run multiple copies of the data and still save significantly in cost (both capital and operating) in relation to mainframe systems. Failover mechanisms are not described in the test implementation, but they are known to persons skilled in the art and there are no significant roadblocks to providing them.

The foregoing description of the system and method for multirecord compression of the invention is illustrative, and variations in configuration and implementation will occur to persons skilled in the art. The scope of the invention is accordingly intended to be limited only by the following claims.

What is claimed is:

1. A method of processing information, comprising the steps of:

a) constructing a plurality of binary objects, each binary object including portions of multiple records of a first unnormalized database table, the multiple records being related by shared attribute values;

b) compressing each of the binary objects constructed in step (a) independently, in a manner that allows the exact reconstruction of original data; and c) constructing a second database table which is still unnormalized from the binary objects constructed in step (a), each row of the second database table comprising the shared attribute values and a corresponding compressed binary object constructed in step b), wherein the second database table stores the shared attribute values and information required to access the compressed binary objects.

2. The method of claim 1, further comprising the step of including a subset of the shared attribute values in each binary object.

3. The method of claim 1, further comprising the step of constructing indices using the shared attribute values.

4. The method of claim 1, further comprising the steps of compressing the binary objects and decompressing the binary objects.

5. The method of claim 1, further comprising the step of providing an application programming interface to access rows of the binary objects.

6. The method of claim 1, wherein the records of the first unnormalized database themselves contain one or more further binary objects representing multiple rows of a database from which the first unnormalized database is derived.

7. The method of claim 1, further comprising the step of storing the first unnormalized database table and the second database table in a storage medium including a hard disk or an electronic memory.

8. The method of claim 1, further comprising the step of recording version information in the second database table.

9. The method of claim 5, further comprising the step of outputting the accessed rows of the binary objects, the binary objects being compressed or not compressed.

10. The method of claim 9, wherein the outputting step outputs decompressed rows when the binary objects are compressed.

11. The method of claim 9, wherein the the outputting step outputs the accessed rows of the binary object over a network.

12. The method of claim 1, wherein the first unnormalized database table represents call detail information.

13. A system for processing information, comprising:

a first unnormalized database table;

a plurality of binary objects, the binary objects including portions of multiple records of the first unnormalized database table, the multiple records being related by shared attribute values;

a compression unit for independently compressing the binary objects so that the compressed binary objects can be exactly reconstructed into the binary objects; and a second database table, comprising the binary objects, each row of the second database table comprising the shared attribute values and a corresponding compressed binary object, wherein the second database table stores the shared attribute values and information required to access the compressed binary objects.

14. The system of claim 13, wherein the compression unit independently compresses the binary objects and includes a subset of the shared attribute values in the compressed binary objects.

15. The system of claim 13, further comprising indices constructed using the shared attribute values.

16. The system of claim 14, further comprising a decompression unit for decompressing the compressed binary objects.

17. The system of claim 13, further comprising an application programming interface for accessing rows of the binary objects.

18. The system of claim 13, wherein the records of the source database themselves contain one or more further binary objects representing multiple rows of a database from which the first database is derived.

19. The system of claim 13, further comprising a storage medium including a hard disk or an electronic memory, the storage medium storing the first unnormalized database table and the second database table.

20. The system of claim 13, wherein the binary objects comprise version information.

21. The system of claim 17, further comprising an output unit for outputting the accessed rows of the binary objects as an output.

22. The system of claim 21, wherein the output comprises decompressed rows.

23. The system of claim 21, wherein the output comprises the accessed rows of the binary objects transmitted over a network.

24. The system of claim 13, wherein the first unnormalized database table represents call detail information.

* * * * *